United States Patent
Funakoshi

(10) Patent No.: US 8,257,994 B2
(45) Date of Patent: Sep. 4, 2012

(54) METHOD FOR MANUFACTURING SOLAR CELL BY FORMING A HIGH CONCENTRATION P-TYPE IMPURITY DIFFUSION LAYER

(75) Inventor: Yasushi Funakoshi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 118 days.

(21) Appl. No.: 12/746,811

(22) PCT Filed: Dec. 8, 2008

(86) PCT No.: PCT/JP2008/072232
§ 371 (c)(1),
(2), (4) Date: Jun. 8, 2010

(87) PCT Pub. No.: WO2009/075244
PCT Pub. Date: Jun. 18, 2009

(65) Prior Publication Data
US 2010/0267187 A1 Oct. 21, 2010

(30) Foreign Application Priority Data
Dec. 13, 2007 (JP) ................... 2007-322187

(51) Int. Cl.
*H01L 21/00* (2006.01)
*H01L 21/302* (2006.01)
(52) U.S. Cl. ............ 438/57; 438/745; 438/755
(58) Field of Classification Search .......... None
See application file for complete search history.

(56) References Cited

U.S. PATENT DOCUMENTS
7,468,485 B1 * 12/2008 Swanson ............ 136/243
2010/0108134 A1 * 5/2010 Ravi ................ 136/256

FOREIGN PATENT DOCUMENTS
| EP | 1 923 906 | 5/2008 |
| JP | 2-123769 | 5/1990 |
| JP | 2003-197932 | 7/2003 |
| JP | 2005-223080 | 8/2005 |
| JP | 2007-49079 | 2/2007 |
| WO | WO 2007/020833 A1 * | 2/2007 |

OTHER PUBLICATIONS
International Search Report for PCT/JP2008/072232, mailed Feb. 10, 2009.

* cited by examiner

*Primary Examiner* — Scott B Geyer
(74) *Attorney, Agent, or Firm* — Nixon & Vanderhye P.C.

(57) ABSTRACT

The present invention provides a method for manufacturing a solar cell, including: diffusing p type impurity into at least a portion of a first surface, which is one surface of a silicon substrate, to form a high concentration p type impurity diffusion layer; and etching one of the first surface of the silicon substrate and a second surface of the silicon substrate opposite to the first surface, using as a mask at least one of the high concentration p type impurity diffusion layer and a film formed on the high concentration p type impurity diffusion layer upon forming the high concentration p type impurity diffusion layer.

6 Claims, 4 Drawing Sheets

(a)

(b)

(c)

(d)

(e)

(f)

(a)

(b)

(c)

(d)

(e)

(f)

(a)

(b)

(c)

(d)

(e)

(f)

(g)

(a)

(b)

(c)

(d)

(e)

(f)

(g)

(a)

(b)

(c)

(d)

(e)

(f)

(g)

METHOD FOR MANUFACTURING SOLAR CELL BY FORMING A HIGH CONCENTRATION P-TYPE IMPURITY DIFFUSION LAYER

This application is the U.S. national phase of International Application No. PCT/JP2008/072232 filed 8 Dec. 2008, which designated the U.S. and claims priority to Japan Application No. 2007-322187 filed 13 Dec. 2007, the entire contents of each of which are hereby incorporated by reference.

TECHNICAL FIELD

The present invention relates to a method for manufacturing a solar cell, in particular, to a method for manufacturing a solar cell excellent in power generation efficiency inexpensively.

BACKGROUND ART

In recent years, problems of exhaustion of energy resources and global environmental issues such as increasing $CO_2$ in the atmosphere have driven demands for development of clean energy. In particular, utilization of solar cells for photovoltaic power generation has been developed, been put into practical use, and been expanded as a new energy source.

In an exemplary conventional mainstream solar cell of such solar cells, a monocrystalline or polycrystalline silicon substrate has a surface (light-receiving surface) via which sunlight enters and in which an impurity of conductive type opposite to that of the silicon substrate is diffused to form a pn junction in the vicinity of the light receiving surface. In the silicon substrate, electrodes for one type are formed on the light receiving surface and electrodes for another type are formed on a surface (back surface) opposite thereto. In addition, in solar cells, generally, an aluminum paste is printed on the back surface of a p type silicon substrate and is sintered to form a high concentration p type impurity diffusion layer, thus allowing for generation of high power by means of a back-surface field effect.

Further, a plurality of the solar cells configured as above are electrically connected to one another via an inter-connector to form a solar cell string and the solar cell string thus formed is sealed by a resin to fabricate a solar cell module for photovoltaic power generation.

Patent Document 1: Japanese Patent Laying-Open No. 2-123769

DISCLOSURE OF THE INVENTION

Problems to be Solved by the Invention

Now, photovoltaic power generation systems are getting pervasive, but cost for generation of power is higher as compared with thermal power generation or the like. For further widespread adoption of photovoltaic power generation systems, reduced cost for power generation is highly required.

A first way to reduce power generation cost is to reduce material cost. A second way is to improve power generation efficiency of a solar cell. Namely, if power generation efficiency can be improved while material cost is the same, power generation cost is relatively reduced.

However, if a silicon substrate, which accounts for a major part of the material cost, is thinned to reduce material cost, the silicon substrate is greatly warped due to a thick Al—Si alloy layer formed simultaneously upon forming the high concentration p type impurity diffusion layer using the above-described aluminum paste, resulting in cracks in the solar cell. This makes it difficult for the silicon substrate to have a thickness of approximately 200 μm or smaller.

It is considered that the warpage of a silicon substrate is significantly reduced when a high concentration p type impurity diffusion layer is formed by means of thermal diffusion of p type impurity instead of forming the high concentration p type impurity diffusion layer simultaneously upon forming the aluminum electrode through printing and sintering of the aluminum paste. However, this provides a complicated solar cell manufacturing process. As such, the method employing thermal diffusion of p type impurity has not achieved mass production of solar cells yet.

Meanwhile, for improved power generation efficiency, there have been proposed a PERC (Passivated Emitter and Rear Cell) structure, a PERL (Passivated Emitter Rear Locally-diffused cell) structure, and the like. However, manufacturing processes therefor are complicated, thus failing to achieve mass production of solar cells having such structures.

There are common structures between the PERC structure and the PERL structure. Specifically, only a surface portion via which sunlight enters is provided as a non-reflective structure such as a texture structure and the other surface portion is kept flat in order to prevent recombination of carriers in the surface of the solar cell. In addition, a high concentration impurity diffusion layer is formed at a portion just below an electrode to prevent recombination of carriers in the portion just below the electrode, and portions other than the portion just below the electrode are arranged to have a relatively low impurity concentration to prevent recombination of carriers.

However, in order to shape portions of a surface of a silicon substrate differently, for example, etching masks such as silicon oxide films need to be formed on portions of the flat surfaces of the silicon substrate for etching. As such, a step of forming such etching masks is additionally required.

In view of the problems described above, an object of the present invention is to provide a method for manufacturing a solar cell excellent in power generation efficiency, inexpensively.

Means for Solving the Problems

The present invention provides a method for manufacturing a solar cell, including: diffusing p type impurity into at least a portion of a first surface, which is one surface of a silicon substrate, to form a high concentration p type impurity diffusion layer; and etching one of the first surface of the silicon substrate and a second surface of the silicon substrate opposite to the first surface, using as a mask at least one of the high concentration p type impurity diffusion layer and a film formed on the high concentration p type impurity diffusion layer upon forming the high concentration p type impurity diffusion layer.

Preferably, in the method of the present invention for manufacturing a solar cell, the high concentration p type impurity diffusion layer is formed by diffusing boron into the first surface of the silicon substrate as the p type impurity, the film is a layered body constituted by a boron silicide layer and a boron silicate glass layer, the etching is wet etching employing an alkali solution, and at least one selected from a group consisting of the high concentration p type impurity diffusion layer, the boron silicide layer, and the boron silicate glass layer serves as the mask.

In the present invention, the "boron silicate glass layer" refers to a layer formed as a result of reaction of the silicon substrate, the boron, and oxygen existing in atmosphere or the like occurring upon the diffusion of boron into the silicon substrate, whereas the "boron silicide layer" refers to a compound layer of silicon and boron, the compound layer being formed between the boron silicate glass layer and the silicon substrate.

In the method of the present invention for manufacturing a solar cell, the high concentration p type impurity diffusion layer preferably has a surface whose concentration of boron is not less than $1 \times 10^{19}$ atoms/cm$^3$.

In the method of the present invention for manufacturing a solar cell, the etching is preferably performed onto the second surface of the silicon substrate to form an anti-reflection structure at the second surface of the silicon substrate.

In the present invention, the "anti-reflection structure" refers to a structure formed by shaping the surface of the silicon substrate uneven to achieve reduced reflection of sunlight as compared with a case where no anti-reflection structure is formed.

Further, the method of the present invention for manufacturing a solar cell may further include diffusing p type impurity into the first surface of the silicon substrate after the etching while a temperature of the silicon substrate is set lower than that of the silicon substrate upon forming the high concentration p type impurity diffusion layer, so as to form a p type impurity diffusion layer having a p type impurity concentration lower than that of the high concentration p type impurity diffusion layer.

Furthermore, in the method of the present invention for manufacturing a solar cell, the first surface of the silicon substrate may be flat. It should be noted that in the present invention, the term "flat" is a concept encompassing not only complete flatness but also substantial flatness.

Further, in the method of the present invention for manufacturing a solar cell, the silicon substrate preferably has a thickness of 200 µm or smaller.

Effects of the Invention

According to the present invention, there can be provided a method for manufacturing a solar cell excellent in power generation efficiency, inexpensively.

DESCRIPTION OF THE REFERENCE SIGNS

Figure 1:
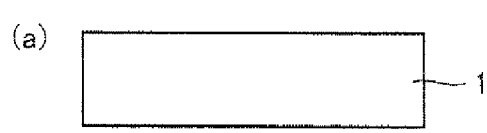
FIGS. 1(a)-(f) are schematic cross sectional views illustrating an exemplary method for manufacturing a solar cell in the present invention.
Figure 1:
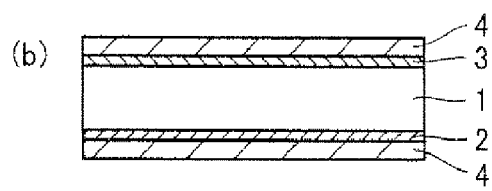
Figure 1:
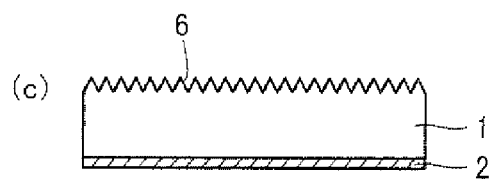
Figure 1:
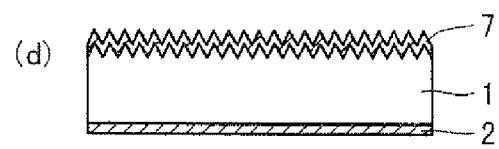
Figure 1:
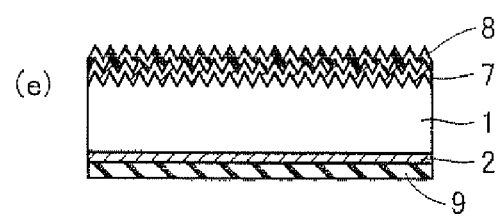
Figure 1:
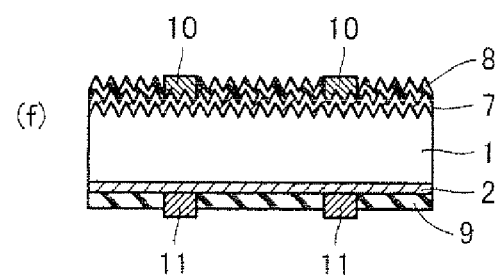

1: silicon substrate; 2: p++ layer; 3: p+ layer; 4; layered body; 5, 12, 13, 14: silicon oxide film; 6: texture structure; 7: n+ layer; 8, 9: passivation film; 10: electrode for n type; 11: electrode for p type.

BEST MODES FOR CARRYING OUT THE INVENTION

The following describes embodiments of the present invention. It should be noted that in the figures of the present invention, the same reference characters are given to indicate the same or equivalent portions.

Test of Etching Characteristics

The present inventors identified respective resistances of a boron diffusion layer, a boron silicide layer, and a boron silicate glass (BSG) layer to an alkali solution. Specifically, the present inventors first employed an alkali solution to remove damage layers of n type silicon substrates to provide flat surfaces thereto. To such n type silicon substrates, boron was thermally diffused by means of vapor-phase diffusion that employs BBr$_3$ (boron tribromide) and application diffusion in which a solution containing a boron compound was applied thereto.

For the vapor-phase diffusion, one surface of an n type silicon substrate was covered with a silicon oxide film serving as a diffusion preventing mask. On the other hand, for the application diffusion, the solution containing a boron compound was applied to one surface of an n type silicon substrate entirely, but no protective layer such as a silicon oxide film was formed on the other surface of the n type silicon substrate, and then boron was thermally diffused thereto.

With the thermal diffusion of boron performed in the ways described above, the following layers were formed on each of the n type silicon substrates: a high concentration p type impurity diffusion layer (p++ layer) serving as a boron diffusion layer; a boron silicate glass (BSG) layer at its outermost surface; and a boron silicide layer disposed between the p++ layer and the BSG layer. Here, the thermal diffusion of boron was performed so that upon thermally diffusing the boron, the n type silicon substrate had a temperature falling within a range of 900° C. to 1000° C.

As a result, in the n type silicon substrate having been through the vapor-phase diffusion, its surface provided with the diffusion preventing mask remained to be n type, but in the n type silicon substrate having been subjected to the above-described application diffusion, the surface to which the solution had not been applied was provided with a p type impurity diffusion layer (p+ layer) having a boron concentration lower than that of the p++ layer. It is considered that the p+ layer was formed due to out-diffusion of boron from the solution containing a boron compound and having been applied to the surface of the n type silicon substrate, into the other surface of the silicon substrate (the term "out-diffusion" herein indicates that the boron is flown and diffused from the solution into the atmosphere).

Next, the n type silicon substrates having been through the vapor-phase diffusion and the application diffusion were etched. The etching of the n type silicon substrates having been through the vapor-phase diffusion and the application diffusion were done under the following conditions: a condition in which the boron silicide layers and the BSG layers existed on the surfaces of the p++ layers and the p+ layers of the n type silicon substrates; and a condition in which the surfaces of the p++ layers and the p+ layers were exposed as a result of removal of the boron silicide layers and the BSG layers.

It should be noted that the boron silicide layers and the BSG layers were removed by annealing under oxygen atmosphere the n type silicon substrates having been through the vapor-phase diffusion and the application diffusion, and then immersing the n type silicon substrates in a hydrogen fluoride solution of high concentration.

Etching solutions employed for the etching were a 2.5-5% potassium hydrate solution heated to 80° C., and a solution including a 2.5-5% potassium hydrate solution and alcohol and heated to 80° C. The latter etching solution is one used in texture etching of a surface of a silicon substrate.

As a result of the etching, the p++ layers of the n type silicon substrates having been through the vapor-phase diffusion and the application diffusion were not completely removed and thus remained in all the conditions, and were not affected at all in some conditions and the surfaces of the p++ layers remained flat in all the conditions.

Meanwhile, it was found that in each n type silicon substrate having been through the vapor-phase diffusion, the surface protected by the diffusion preventing mask and the p++ layer are different in etching rate for the etching solutions by several hundreds times or greater.

Further, the p+ layers formed as a result of the out-diffusion of boron exhibited substantially the same etching characteristics as those of the surfaces protected by the diffusion preventing masks in the n type silicon substrates, were etched in all the conditions, and were removed completely, thus exposing the surfaces of the n type silicon substrates.

Also in the texture etching conditions with weak etching characteristics, the surfaces protected by the diffusion preventing masks as well as the p+ layers formed as a result of the out-diffusion of boron were etched in the n type silicon substrates.

As such, it was observed that although the same impurity was diffused, there was a great difference in etching rate for an alkali solution between a p++ layer and a p+ layer formed as a result of out-diffusion of boron. It was therefore found that a difference in surface concentration of p type impurity made a difference in resistance to the alkali solution.

Furthermore, an n++ layer was formed and was similarly subjected to alkali etching, but etching characteristics thereof were not different from the characteristics of the n type silicon. Hence, the etching resistance to an alkali solution is a characteristic intrinsic to a high concentration p type impurity diffusion layer.

The following describes embodiments of the present invention, i.e., exemplary methods for manufacturing a solar cell using the above-described characteristics.

First Embodiment

Referring to schematic cross sectional views of FIGS. 1(a)-(f), one exemplary method for manufacturing a solar cell in the present invention will be described.

First, as shown in FIG. 1(a), a silicon substrate 1 is prepared. As silicon substrate 1, for example, a substrate formed of p type polycrystalline silicon, monocrystalline silicon, or the like can be employed. It should be noted that the size and shape of silicon substrate 1 are not particularly limited, but silicon substrate 1 can have a shape of, for example, a quadrangle with sides each having a length of 100 mm or longer but 150 mm or shorter. Likewise, the thickness of silicon substrate 1 is not also particularly limited, but silicon substrate 1 preferably has a thickness of 200 μm or smaller in order to prevent warpage of silicon substrate 1, which is a feature that can be obtained as one effect of the present invention and is beneficial in obtaining a thinner silicon substrate 1.

Further, silicon substrate 1 employed herein can be obtained from, for example, an ingot by slicing it and eliminating resulting slice damage. The slice damage can be eliminated by etching the surface of silicon substrate 1 using a mixed acid of a hydrogen fluoride solution and nitric acid, or an alkaline aqueous solution of sodium hydroxide, etc. Preferably, on this occasion, with the etching, the surface of silicon substrate 1 is made flat.

Next, as shown in FIG. 1(b), boron is thermally diffused into the back surface of silicon substrate 1 by application diffusion, i.e., by applying a solution containing boron to the back surface of silicon substrate 1 and thereafter heating it. In this way, a high concentration p type impurity diffusion layer (p++ layer) 2 is formed. On this occasion, on a surface of p++ layer 2, there is formed a layered body 4 in which a boron silicide layer and a boron silicate glass (BSG) layer are formed in this order.

Here, when the application diffusion is performed without forming a diffusion preventing mask on a surface (light receiving surface) opposite to the back surface of silicon substrate 1, out-diffusion of boron from the solution applied to the back surface of silicon substrate 1 takes place, whereby a p type impurity diffusion layer (p+ layer) 3 is formed on the light receiving surface of silicon substrate 1 and a layered body 4 in which a boron silicide layer and a BSG layer are formed in this order is formed on the surface of p+ layer 3 as shown in FIG. 1(b). Thus, FIG. 1(b) shows silicon substrate 1 having its light receiving surface that is not provided with a diffusion preventing mask and having been subjected to the application diffusion.

Meanwhile, upon the application diffusion, a diffusion preventing mask may be formed on the light receiving surface of silicon substrate 1. Further, instead of the application diffusion, vapor-phase diffusion may be performed using a boron compound. If no diffusion preventing mask is formed on the light receiving surface thereof upon the vapor-phase diffusion, a p++ layer 2 is also formed on the light receiving surface of silicon substrate 1, so it is preferable to form a diffusion preventing mask on the light receiving surface of silicon substrate 1.

In other words, by forming the p++ layer by means of the application diffusion, the step of forming a diffusion preventing mask can be omitted. Hence, the application diffusion is preferable for the formation thereof. Here, as the diffusion preventing mask, for example, an silicon oxide film, a silicon nitride film, or the like can be employed each of which is formed through a CVD (chemical vapor deposition) method or the like.

Thereafter, as shown in FIG. 1(c), the light receiving surface of silicon substrate 1 is subjected to texture etching to form a texture structure 6, which is one exemplary antireflection structure, on the light receiving surface of silicon substrate 1. In the texture etching of the light receiving surface of silicon substrate 1, an alkali solution including a sodium hydroxide solution or potassium hydrate solution and isopropyl alcohol and heated to for example 70° C. or higher but 80° C. or lower is employed as an etching solution to etch the light receiving surface of silicon substrate 1.

As shown in the above-described results of the test of etching characteristics, p+ layer 3 on the light receiving surface of silicon substrate 1 can be etched while preventing the back surface of silicon substrate 1 from being etched and therefore securing p++ layer 2, even in the cases where layered bodies 4 constituted by the boron silicide layers and the BSG layers remain on the surfaces of silicon substrate 1 and where layered bodies 4 constituted by the boron silicide layers and the BSG layers are removed in advance before the texture etching. Namely, p layer 2 on the back surface of silicon substrate 1 is prevented from being etched, but p+ layer 3 on the light receiving surface of silicon substrate 1 is etched. Here, layered bodies 4 constituted by the boron silicide layers and the BSG layers are annealed under oxygen atmosphere and thereafter are removed using a hydrogen fluoride solution or the like.

Where a diffusion preventing mask was formed on the light receiving surface of silicon substrate 1 in the foregoing step of thermally diffusing boron as shown in FIG. 1(b), silicon substrate 1 in this step is a substrate from which the diffusion preventing mask has been removed using a hydrogen fluoride solution or the like. On the other hand, where no diffusion preventing mask was formed on the light receiving surface of silicon substrate 1, silicon substrate 1 after the formation of p++ layer 2 thereon is used without modification.

Next, as shown in FIG. 1(d), n type impurity is diffused into the light receiving surface thus provided with the texture structure in silicon substrate 1, thereby forming an n type impurity diffusion layer (n+ layer) 7. Specifically, n+ layer 7 can be formed, for example, as follows. A diffusion preventing mask constituted by for example a silicon oxide film is formed on the back surface of silicon substrate 1. Then, phosphorus is diffused into the light receiving surface of silicon substrate 1 by means of application diffusion or vapor-phase diffusion. In the application diffusion herein, a solution containing phosphorus is applied to the light receiving surface of silicon substrate 1 and it is then heated, whereas in the vapor-phase diffusion herein, a phosphorus compound is employed. After the formation thereof, a PSG (phosphorus silicate glass) film formed on the light receiving surface of silicon substrate 1 in association with the diffusion of phosphorus as well as the diffusion preventing mask on the back surface of silicon substrate 1 are removed using for example a hydrogen fluoride solution or the like.

Then, as shown in FIG. 1(e), a passivation film 8 also serving as an anti-reflection film is formed on the light receiving surface of silicon substrate 1, whereas a passivation film 9 is formed on the back surface of silicon substrate 1. Here, each of passivation films 8 and 9 employed herein can be, for example, a silicon nitride film formed using a plasma CVD method, an silicon oxide film formed using the plasma CVD method or a thermal oxidation method, or the like. It should be noted that passivation films 8 and 9 may be formed of the same material or different materials. Further, as each of passivation films 8 and 9, a layered body film constituted by the silicon oxide film and the silicon nitride film can be used.

Next, as shown in FIG. 1(f), electrodes 10 for n type are formed on the light receiving surface of silicon substrate 1, and electrodes 11 for p type are formed on the back surface of silicon substrate 1. Here, electrodes 10 for n type are electrodes brought into electric contact with n+ layer 7 by, for example, printing a silver paste onto the surface of passivation film 8 in the form of a lattice and thereafter sintering it for fire-through. Likewise, electrodes 11 for p type are electrodes brought into electric contact with p++ layer 2 by, for example, printing a silver paste onto the surface of passivation film 9 in the form of a lattice and thereafter sintering it for fire-through. With the steps described heretofore, a solar cell is completed.

Second Embodiment

Referring to schematic cross sectional views of FIGS. 2(a)-(g), another exemplary method for manufacturing a solar cell in the present invention will be described.

Figure 2:
FIGS. 2(a)-(g) are schematic cross sectional views illustrating another exemplary method for manufacturing a solar cell in the present invention.
Figure 2:
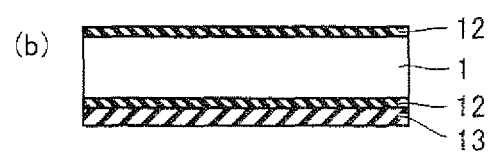
Figure 2:
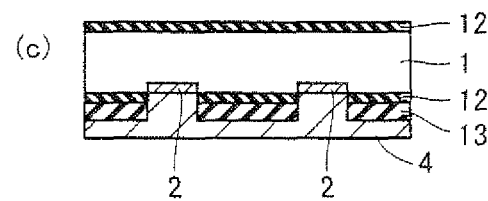
Figure 2:
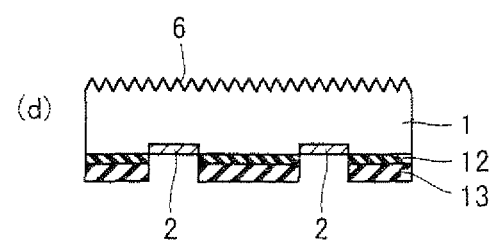
Figure 2:
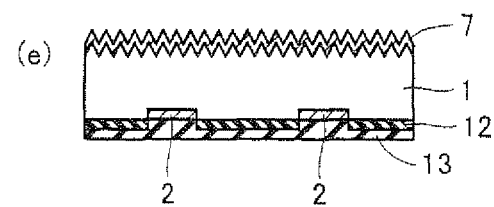
Figure 2:
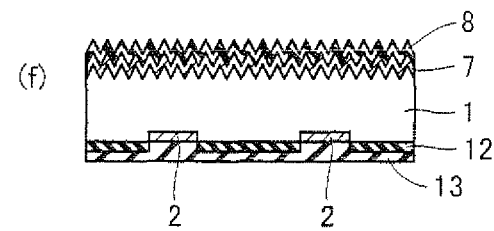
Figure 2:
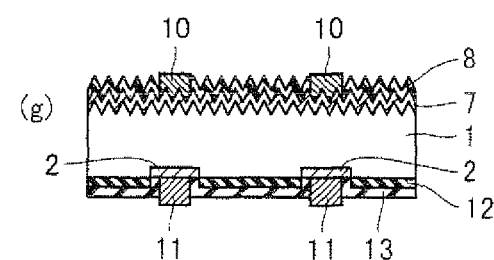

First, as shown in FIG. 2(a), as with the first embodiment, a silicon substrate 1 formed of a p type polycrystalline silicon, monocrystalline silicon, or the like is prepared.

Next, as shown in FIG. 2(b), for example, silicon oxide films 12 are formed on the light receiving surface and back surface of silicon substrate 1 respectively, using a thermal oxidation method. Thereafter, on silicon oxide film 12 formed on the back surface of silicon substrate 1, a silicon oxide film 13 is formed as a protective layer.

Here, the temperature of heating silicon substrate 1 in the thermal oxidation method is not particularly limited but is preferably equal to or higher than that of silicon substrate 1 upon the below-described thermal diffusion of boron. Since silicon oxide film 12 formed on the back surface of silicon substrate 1 using the thermal oxidation method serves as a passivation film on the back surface of silicon substrate 1, silicon oxide film 13 is preferably formed as a protective layer on the silicon oxide film 12 provided on the back surface of silicon substrate 1 so as to prevent silicon oxide film 12 from being etched in a subsequent step. It should be noted that silicon oxide film 13 can be formed by, for example, an atmospheric pressure CVD method or the like, and the thickness of silicon oxide film 13 can be set appropriately depending on a condition in a subsequent step but can be for example 300 nm or greater but 800 nm or smaller.

Next, as shown in FIG. 2(c), p++ layers 2 are formed on portions of the back surface of silicon substrate 1, and a layered body 4 constituted by a boron silicide layer and a BSG layer formed in this order is formed on the surfaces of p++ layers 2 and silicon oxide film 13.

Specifically, p++ layers 2 and layered body 4 are formed, for example, as follows. Silicon oxide film 12 and silicon oxide film 13 on the back surface of silicon substrate 1 are partially etched to expose portions of the back surface of silicon substrate 1. Thereafter, boron was diffused into the back surface of silicon substrate 1 by means of application diffusion, i.e., by applying a solution containing boron entirely onto the back surface of silicon substrate 1 and heating it, or by means of vapor-phase diffusion employing a boron compound. In this way, p++ layers 2 are formed. The shapes of p++ layers 2 are not particularly limited, and can be set appropriately depending on a concentration of boron to be diffused or the like, but can be, for example, circles each having a diameter of 200 μm and arranged at a pitch of 300 μm.

Next, as shown in FIG. 2(d), the light receiving surface of silicon substrate 1 is subjected to texture etching to form a texture structure 6, which is one exemplary anti-reflection structure, on the light receiving surface of silicon substrate 1. The texture etching of the light receiving surface of silicon substrate 1 takes place as follows. Silicon oxide film 12 on the light receiving surface of silicon substrate 1 is removed using for example a hydrogen fluoride solution or the like, and the etching is then performed using an etching solution. The etching solution usable herein is, for example, an alkali solution including a sodium hydroxide solution or potassium hydrate solution and isopropyl alcohol and heated to for example 70° C. or higher but 80° C. or lower.

It should be noted that layered body 4 constituted by the boron silicide layer and the BSG layer and formed together with p++ layers 2 serves as a good etching mask upon the texture etching of the light receiving surface of silicon substrate 1. After the step of texture etching, layered body 4 has a thickness that causes no problem in a subsequent step, or has been completely etched away to expose p++ layers 2. Further, on the back surface of silicon substrate 1 at portions not provided with p++ layers 2, silicon oxide film 13 formed in the step shown in. FIG. 2(b) using the atmospheric pressure CVD or the like has a thickness sufficiently durable for the texture etching, whereby the back surface of silicon substrate 1 can be kept flat in shape.

Next, as shown in FIG. 2(e), in silicon substrate 1, n type impurity is diffused into the light receiving surface thus provided with the texture structure, so as to form an n+ layer 7. Here, n+ layer 7 can be formed by diffusing phosphorus into the light receiving surface of silicon substrate 1 through application diffusion in which a solution containing phosphorus is applied to the light receiving surface of silicon substrate 1, or through vapor-phase diffusion employing a phosphorus compound. On this occasion, silicon oxide film 13 formed using the atmospheric pressure CVD or the like serves as a diffusion preventing mask with a sufficient thickness for protecting the p++ layers from the diffusion of phosphorus. Thereafter, a PSG film formed on the light receiving surface of silicon substrate 1 in association with the diffusion of phosphorus is removed using a hydrogen fluoride solution or the like.

Then, as shown in FIG. 2(f), a passivation film 8 also serving as an anti-reflection film is formed on the light receiving surface of silicon substrate 1. Passivation film 8 employed herein can be, for example, a silicon nitride film formed using a plasma CVD method, an silicon oxide film formed using the plasma CVD method or thermal oxidation method, or the like. Further, as passivation film 8, a layered body film constituted by the silicon oxide film and the silicon nitride film can be employed.

Next, as shown in FIG. 2(g), electrodes 10 for n type are formed on the light receiving surface of silicon substrate 1, whereas electrodes 11 for p type are formed on the back surface of silicon substrate 1. Here, electrodes 10 for n type are electrodes brought into electric contact with n+ layer 7 by, for example, printing a silver paste onto the surface of passivation film 8 in the form of a lattice and thereafter sintering it for fire-through. Likewise, electrodes 11 for p type are electrodes brought into electric contact with p++ layers 2 by, for example, printing a silver paste onto the surface of passivation film 9 in the form of dots and thereafter sintering it for fire-through. With the steps described heretofore, a solar cell is completed.

Third Embodiment

Referring to schematic cross sectional views of FIGS. 3(a)-(g), still another exemplary method for manufacturing a solar cell in the present invention will be described.

Figure 3:
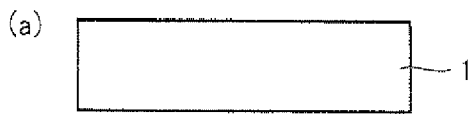
FIGS. 3(a)-(g) are schematic cross sectional views illustrating still another exemplary method for manufacturing a solar cell in the present invention.
Figure 3:
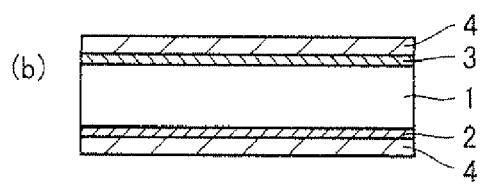
Figure 3:
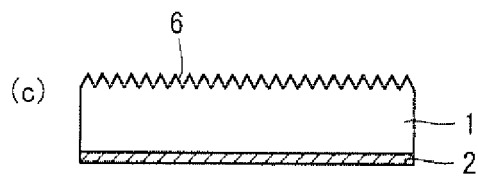
Figure 3:
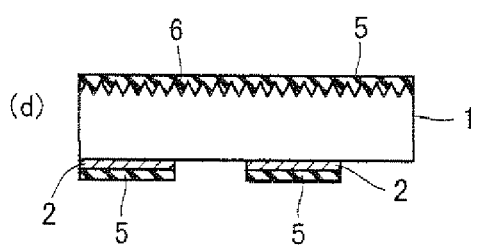
Figure 3:
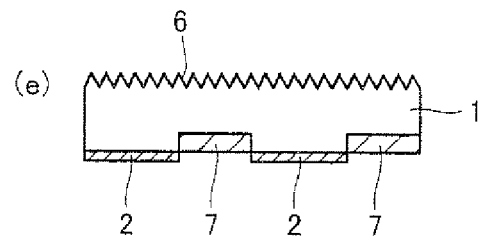
Figure 3:
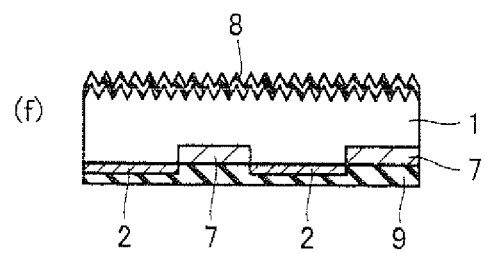
Figure 3:
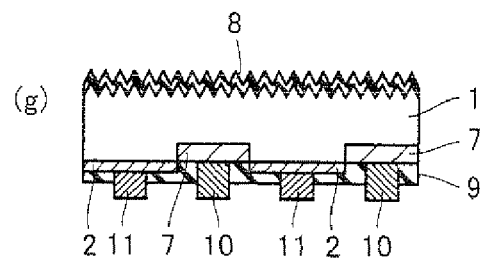

Steps shown in FIGS. 3(a)-(c) can be performed in manners similar to those shown in FIGS. 1(a)-(c) of the first embodiment.

Next, as shown in FIG. 3(d), diffusion preventing masks 5 each constituted by an silicon oxide film or the like are formed on the surface of p++ layer 2 provided on the back surface of silicon substrate 1 and the light receiving surface thereof respectively. Then, portions of diffusion preventing mask 5 provided on the back surface of silicon substrate 1 as well as portions of p++ layer 2 are removed by means of etching to expose portions of the back surface of silicon substrate 1.

Specifically, for the removal of the portions of diffusion preventing mask 5 and p++ layer 2, an acid-resistant resist (not shown) is printed onto diffusion preventing mask 5, formed entirely on the surface of p++ layer 2 provided on the back surface of silicon substrate 1, at its portions corresponding to portions in which n+ layers 7 described below are to be formed. It should be noted that open portions, portions to which the acid-resistant resist is not printed, can be shaped in the form of a comb, for example. Further, each of diffusion preventing masks 5 employed herein can be, for example, a mask constituted by an silicon oxide film or a silicon nitride film formed using the CVD method or the like.

Then, the portions of diffusion preventing mask 5 exposed from the portions to which the acid-resistant resist is not printed, and the portions of p++ layer 2 below diffusion preventing mask 5 are etched using a mixed acid of a hydrogen fluoride solution and a nitric acid solution, to expose the back surface of silicon substrate 1. Here, in order to prevent attachment of stain onto p++ layer 2 provided on the back surface of silicon substrate 1, the percentage of the hydrogen fluoride solution is preferably 5% by mass or smaller in the mixed acid of the hydrogen fluoride solution and the nitric acid solution, and it is preferable to use a solution adjusted with a solution including water and acetic acid. Further, in order to remove attached stain, it can be immersed in an alkaline aqueous solution such as a potassium hydrate solution after the etching with the mixed acid. Furthermore, instead of the treatment with the mixed acid, a paste containing an alkaline component is printed onto diffusion preventing mask 5 at its portions corresponding to the portions in which n+ layers 7 are to be formed, and it is thereafter heated. In this way, the portions of diffusion preventing mask 5 and p++ layer 2 therebelow can be etched. It should be noted that p++ layer 2 has a resistance to an alkali solution as described above, but p++ layer 2 can be etched if a paste containing an alkaline component is printed and thereafter it is heated to 100° C. or higher.

Next, after removing the acid-resistant resist, as shown in FIG. 3(c), n+ layers 7 are formed on the exposed portions of the back surface of silicon substrate 1. Here, n+ layers 7 can be formed by diffusing phosphorus into the exposed portions of the back surface of silicon substrate 1 through application diffusion in which a solution containing phosphorus is applied to the exposed portions of the back surface of silicon substrate 1, or through vapor-phase diffusion employing a phosphorus compound. Thereafter, a PSG (phosphorus silicate glass) film formed on the light receiving surface of silicon substrate 1 in association with the diffusion of phosphorus, and diffusion preventing mask 5 provided on the back surface of silicon substrate 1 are removed using, for example, a hydrogen fluoride solution or the like.

Next, as shown in FIG. 3(f), a passivation film 8 also serving as an anti-reflection film is formed on the light receiving surface of silicon substrate 1, and a passivation film 9 is formed on the back surface of silicon substrate 1. Here, each of passivation films 8 and 9 employed herein can be, for example, a silicon nitride film formed using a plasma CVD method, an silicon oxide film formed using the plasma CVD method or thermal oxidation method, or the like. It should be noted that passivation films 8 and 9 may be formed of the same material or different materials. Further, as each of passivation films 8 and 9, a layered body film constituted by a silicon oxide film and a silicon nitride film can be used.

Next, as shown in FIG. 3(g), electrodes 10 for n type are formed on n+ layers 7 provided on the back surface of silicon substrate 1, and electrodes 11 for p type are formed on p++ layers 2 provided on the back surface of silicon substrate 1. Electrodes 10 for n type are electrodes brought into electric contact with n+ layers 7 by, for example, printing a silver paste onto the surface of passivation film 9 and thereafter sintering it for fire-through. Likewise, electrodes 11 for p type are electrodes brought into contact with p++ layers 2 by, for example, printing a silver paste onto the surface of passivation film 9 and thereafter sintering it for fire-through. With the steps described heretofore, a solar cell is completed.

In the third embodiment, both n+ layers 7 and p++ layer 2 are formed on the back surface of silicon substrate 1. Hence, also when an n type silicon substrate is employed as silicon substrate 1, a solar cell can be formed using a method similar to that in the third embodiment.

Further, in the third embodiment, both p++ layer 2 and n+ layers 7 can be also formed on the back surface of silicon substrate 1 by forming n+ layers 7 by selectively etching, with a 5% potassium hydrate solution, the portions having been turned into the p+ layers as a result of out-diffusion in the back surface of silicon substrate 1 when the solution containing boron is applied to the back surface of silicon substrate 1 in the form of a predetermined shape to form p++ layer 2, and thereafter performing vapor-phase diffusion using a phosphorus compound.

Fourth Embodiment

Referring to schematic cross sectional views of FIGS. 4(a)-(g), yet another exemplary method for manufacturing a solar cell in the present invention will be described.

Figure 4:
FIGS. 4(a)-(g) are schematic cross sectional views illustrating yet another exemplary method for manufacturing a solar cell in the present invention.
Figure 4:
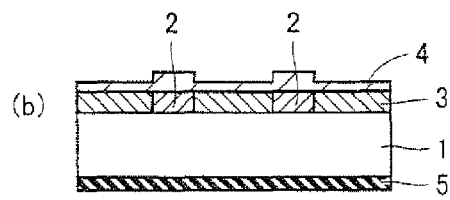
Figure 4:
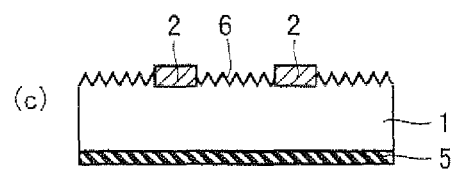
Figure 4:
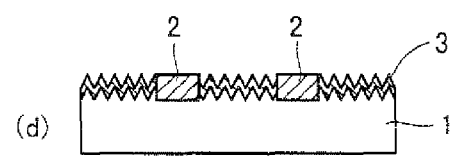
Figure 4:
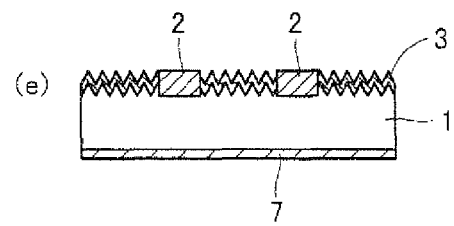
Figure 4:
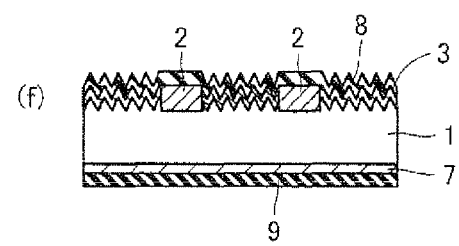
Figure 4:
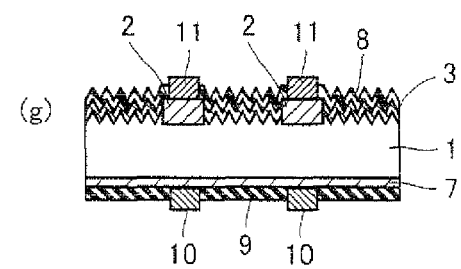

First, as shown in FIG. 4(a), a silicon substrate 1 is prepared. Here, silicon substrate 1 is preferably formed of an n type polycrystalline silicon or monocrystalline silicon.

Next, as shown in FIG. 4(b), p++ layers 2 and p+ layers 3 are formed on the light receiving surface of silicon substrate 1, and a layered body 4 in which a boron silicide layer and a BSG layer are formed in this order is formed on the surfaces of these layers, and a diffusion preventing mask 5 is formed on the back surface of silicon substrate 1.

Specifically, p++ layers 2 can be formed by, for example, application diffusion in which a solution containing boron is applied to the light receiving surface of silicon substrate 1 in a predetermined pattern by means of screen printing and thereafter it is heated. The application diffusion causes out-diffusion of boron, resulting in formation of p+ layers 3. Further, along with the formation of p++ layers 2 and p+ layers 3, layered body 4 in which the boron silicide layer and the BSG layer are formed in this order is formed on the surfaces thereof. Diffusion preventing mask 5 employed herein can be, for example, an silicon oxide film or silicon nitride film formed using an atmospheric pressure CVD method or the like.

Next, as shown in FIG. 4(c), the light receiving surface of silicon substrate 1 is subjected to texture etching to form a texture structure 6, which is one exemplary anti-reflection structure, on the light receiving surface of silicon substrate 1. Here, texture structure 5 can be formed at the light receiving surface of silicon substrate 1 by etching with an etching solution. The etching solution employed herein can be, for example, an alkali solution including a sodium hydroxide solution or potassium hydrate solution and isopropyl alcohol and heated to, for example, 70° C. or higher but 80° C. or lower.

Upon the texture etching of the light receiving surface of silicon substrate 1, p+ layer 3 and layered body 4 both formed together with p++ layers 2 are etched along with the light receiving surface of silicon substrate 1. They are etched away but P++ layers 2 each have a resistance to the alkali solution and are therefore prevented from being etched thus remaining on the light receiving surface of silicon substrate 1. Further, diffusion preventing mask 5, formed on the back surface of silicon substrate 1, serves as an etching mask to prevent the back surface of silicon substrate 1 from being etched.

Next, as shown in FIG. 4(d), boron is diffused into the light receiving surface of silicon substrate 1 to form a p+ layer 3. Specifically, p+ layer 3 can be formed by, for example, thermally diffusing boron into the light receiving surface of silicon substrate 1 through application diffusion in which a solution containing boron is applied thereto and it is thereafter heated, or through vapor-phase diffusion employing a boron compound. It should be noted that upon the thermal diffusion of boron, silicon substrate 1 has a temperature lower than that of silicon substrate 1 upon forming p++ layers 2 as shown in FIG. 4(b), whereby p+ layer 3 has a boron concentration lower than that in p++ layers 2.

Further, upon formation of p+ layer 3, a diffusion preventing mask is formed on the back surface of silicon substrate 1 to prevent the thermal diffusion of boron at the back surface of silicon substrate 1. In this way, a p+ layer 3 can be effectively prevented from being formed thereon. Here, the diffusion preventing mask employed herein can be the one used in the step shown in FIG. 4(b) without any modification. The diffusion preventing mask is removed after the formation of p+ layer 3, and the boron silicide layer and BSG layer resulting from the formation of p+ layer 3 are also removed using a hydrogen fluoride solution or the like after being annealed under oxygen atmosphere.

Next, as shown in FIG. 4(e), n type impurity is diffused into the back surface of silicon substrate 1 to form an n+ layer 7. Here, a diffusion preventing mask constituted by for example an silicon oxide film is formed on the light receiving surface of silicon substrate 1, and n+ layer 7 is formed by diffusing phosphorus into the back surface of silicon substrate 1 through, for example, application diffusion in which a solution containing phosphorus is applied to the back surface of silicon substrate 1 and it is then heated; or vapor-phase diffusion employing a phosphorus compound. Thereafter, a PSG film formed on the back surface of silicon substrate 1 in association with the diffusion of phosphorus, as well as the diffusion preventing mask on the light receiving surface of silicon substrate 1 are removed using for example a hydrogen fluoride solution.

Next, as shown in FIG. 4(f), a passivation film 8 also serving as an anti-reflection film are formed at the light receiving surface of silicon substrate 1, and a passivation film 9 is formed at the back surface of silicon substrate 1. Here, each of passivation films 8 and 9 employed herein can be, for example, a silicon nitride film formed using a plasma CVD method, or an silicon oxide film formed using the plasma CVD method or thermal oxidation method. It should be noted that passivation films 8 and 9 may be formed of the same material or different materials. As each of passivation films 8 and 9, a layered body film constituted by the silicon oxide film and the silicon nitride film can be used.

Next, as shown in FIG. 4(g), electrodes 10 for n type are formed on n+ layer 7 provided on the back surface of silicon substrate 1, and electrodes 11 for p type are formed on p++ layers 2 provided on the light receiving surface of silicon substrate 1.

Here, electrodes 10 for n type can be formed as electrodes brought into electric contact with n+ layer 7 by, for example, printing a silver paste onto the surface of passivation film 9 and thereafter sintering it for fire-through of the silver paste. Likewise, electrodes 11 for p type can be formed as electrodes brought into electric contact with p++ layers 2 by, for example, printing a silver paste onto the surface of passivation film 8 and thereafter sintering it for fire-through thereof. With the steps described heretofore, a solar cell is completed.

In any of the first to fourth embodiments, no aluminum paste is sintered upon the formation of p++ layer(s) 2, thus preventing warpage of silicon substrate 1. In this way, silicon substrate 1 can be thinner, which accordingly achieves reduced material cost.

Also in any of the first to fourth embodiments, upon etching with an alkali solution such as texture etching, no etching mask needs to be newly formed because layered body (bodies) 4 constituted by a boron silicate layer and a BSG layer formed in association with the formation of p++ layer(s) 2 can be used as an etching mask, and further the surface(s) of p++ layer(s) 2 can remain flat after the etching. In this way, the number of steps can be reduced, thus achieving reduced manufacturing cost. In addition, recombination of carriers at the surface(s) of p++ layer(s) 2 can be effectively prevented, which provides the solar cell with excellent power generation efficiency.

EXAMPLES

Test of Etching Characteristics

It was identified how a boron diffusion layer, a boron silicide layer, and a BSG layer, each of which is formed on an n type silicon substrate, are resistant to an alkali solution.

First, an alkali solution was employed to remove damage layers of n type silicon substrates to provide the n type silicon substrates with flat surfaces. Then, boron was thermally diffused thereinto. Here, the thermal diffusion of boron was performed using vapor-phase diffusion that employs $BBr_3$ and application diffusion in which a solution containing a boron compound is applied thereto. A treatment temperature in each of the vapor-phase diffusion and the application diffusion was set at 950° C.

In the case where the vapor-phase diffusion was employed for the thermal diffusion of boron, one surface of an n type silicon substrate was covered with a silicon oxide film to form a diffusion preventing mask thereon. On the other hand, in the case where the application diffusion was employed for the thermal diffusion of boron, a solution containing a boron compound was applied entirely onto one surface of an n type silicon substrate, no protective layer or the like was formed on the other surface thereof, and boron was diffused.

When the vapor-phase diffusion and the application diffusion were employed for the thermal diffusion of boron as such, a p++ layer formed as a result of the thermal diffusion of boron was formed on each n type silicon substrate, a BSG layer was formed at its outermost surface, and a boron silicide layer was formed between the p++ layer and the BSG layer.

Table 1 shows sheet resistances and conductive types of the surfaces of the silicon substrates having been through the thermal diffusion of boron, i.e., the vapor-phase diffusion and the application diffusion. Here, each of the sheet resistances is a value measured at the central portion of the surface of a silicon substrate.

It should be noted that in Table 1, (P) indicates a p-type semiconductor and (N) indicates an n-type semiconductor. Further, in Table 1, the column "diffusion surface/application surface" indicates a sheet resistance ($\Omega/\square$) of the silicon substrate's surface not provided with the diffusion preventing mask in the case of the vapor-phase diffusion, and indicates a sheet resistance ($\Omega/\square$) of the silicon substrate's surface to which the solution containing the boron compound had been applied in the case of the application diffusion. Further, in Table 1, the column "surface opposite to surface with diffusion preventing mask/application surface" indicates a sheet resistance ($\Omega/\square$) of the silicon substrate's surface provided with the diffusion preventing mask in the case of the vapor-phase diffusion, and indicates a sheet resistance ($\Omega/\square$) of the silicon substrate's surface to which the solution containing the boron compound had not been applied in the case of the application diffusion.

TABLE 1

| | Diffusion surface/ application surface | Surface opposite to surface with diffusion preventing mask/ application surface |
|---|---|---|
| Vapor-phase diffusion | 25-30 $\Omega/\square$ (P) | 100-115 $\Omega/\square$ (N) |
| Application diffusion | 25-30 $\Omega/\square$ (P) | 90-100 $\Omega/\square$ (P) |

Thereafter, the silicon substrates having been through the thermal diffusion of boron were etched. Etching solutions employed herein were an etching solution of a 2.5-5% potassium hydrate solution heated to 80° C.; and an etching solution including a 2.5-5% potassium hydrate solution and isopropyl alcohol and heated to 80° C. Specifically, each of the silicon substrates having been the vapor-phase diffusion and the application diffusion was etched under the following conditions, a condition in which the boron silicide layer and the BSG layer were present on the surfaces of the p++ layer and p+ layer in the silicon substrate; and a condition in which the p++ layer and p+ layer were exposed by removing the boron silicide layer and the BSG layer.

The boron silicide layers and the BSG layers were removed by annealing, under oxygen atmosphere, the n type silicon substrates having been through the vapor-phase diffusion and the application diffusion, and thereafter immersing the n type silicon substrates in a hydrogen fluoride solution of high concentration.

Among the above-described etching solutions, experimental results will be described below particularly for an etching solution including a 2.5% potassium hydrate solution and isopropyl alcohol and heated to 80° C., and an etching solution including a 5% potassium hydrate solution and heated to 80° C. With the solution including 5% potassium hydrate solution and heated to 80° C., a silicon substrate is isotropically etched, so the silicon substrate etched by the solution will have a surface flat in shape. Meanwhile, it is known that the etching solution including 2.5% potassium hydrate solution and alcohol and heated to 80° C. has suppressed etching characteristics for the silicon substrate due to the alcohol included, whereby the silicon substrate was etched anisotropically. Hence, generally, it is used as an etching solution for texture etching of a surface of a silicon substrate.

Table 2 shows sheet resistances and conductive types of the surfaces of the silicon substrates having been through the vapor-phase diffusion and the application diffusion and been etched using the etching solution including 5% potassium hydrate solution and heated to 80° C. Meanwhile, Table 3 shows sheet resistances and conductive types of the surfaces of the silicon substrates having been through the vapor-phase diffusion and the application diffusion and been etched using the etching solution including 2.5% potassium hydrate solution and alcohol and heated to 80° C.

In each of Tables 2 and 3, the "p layer-BSG" shows sheet resistances and conductive types of the silicon substrates etched for treatment times shown in Tables 2 and 3 under conditions that the boron silicide layers and the BSG layers are presented in the silicon substrates. The "p layer exposed" therein shows sheet resistances and conductive types of the silicon substrates etched for treatment times shown in Tables 2 and 3 after removing the boron silicide layers and the BSG layers.

Further, also in each of Tables 2 and 3, (P) indicates a p-type semiconductor and (N) indicates an n-type semiconductor. Furthermore, the column "diffusion surface/application surface" in each of Tables 2 and 3 indicates a sheet resistance ($\Omega/\square$) that each silicon substrate's surface having not been provided with the diffusion preventing mask in the case of the vapor-phase diffusion had after the etching, and indicates a sheet resistance ($\Omega/\square$) that each silicon substrate's surface to which the solution containing the boron compound had been applied in the case of the application diffusion had after the etching.

Further, in each of Tables 2 and 3, the column "surface opposite to surface with diffusion preventing mask/application surface" indicates a sheet resistance ($\Omega/\square$) that each silicon substrate's surface having been provided with the diffusion preventing mask in the case of the vapor-phase diffusion had after the etching, and indicates a sheet resistance ($\Omega/\square$) that each silicon substrate's surface to which the solution containing the boron compound had not been applied in the case of the application diffusion had after the etching.

TABLE 2

| State | | Treatment time | Diffusion surface/ application surface | Surface opposite to surface with diffusion preventing mask/application surface |
|---|---|---|---|---|
| Vapor-phase diffusion | P layer- BSG | 3 min | 28 Ω/☐ (P) | 118 Ω/☐ (N) |
| | | 5 min | 27 Ω/☐ (P) | 108 Ω/☐ (N) |
| | P layer exposed | 3 min | 48 Ω/☐ (P) | 110 Ω/☐ (N) |
| | | 5 min | 111 Ω/☐ (P) | 106 Ω/☐ (N) |
| Application diffusion | P layer- BSG | 3 min | 26 Ω/☐ (P) | 115 Ω/☐ (N) |
| | | 5 min | 27 Ω/☐ (P) | 109 Ω/☐ (N) |
| | P layer exposed | 3 min | 53 Ω/☐ (P) | 109 Ω/☐ (N) |
| | | 5 min | 112 Ω/☐ (P) | 114 Ω/☐ (N) |

TABLE 3

| State | | Treatment time | Diffusion surface/ application surface | Surface opposite to surface with diffusion preventing mask/application surface |
|---|---|---|---|---|
| Vapor-phase diffusion | P layer- BSG | 30 min | 28 Ω/☐ (P) | 107 Ω/☐ (N) |
| | | 60 min | 39 Ω/☐ (P) | 112 Ω/☐ (N) |
| | P layer exposed | 30 min | 30 Ω/☐ (P) | 110 Ω/☐ (N) |
| | | 60 min | 65 Ω/☐ (P) | 106 Ω/☐ (N) |
| Application diffusion | P layer- BSG | 30 min | 31 Ω/☐ (P) | 106 Ω/☐ (N) |
| | | 60 min | 43 Ω/☐ (P) | 113 Ω/☐ (N) |
| | P layer exposed | 30 min | 31 Ω/☐ (P) | 110 Ω/☐ (N) |
| | | 60 min | 76 Ω/☐ (P) | 105 Ω/☐ (N) |

In each of Tables 1-3, although manners of diffusing were different between the vapor-phase diffusion and the application diffusion, the diffusion surfaces and the application surfaces exhibited substantially the same results under all the conditions. Here, the experimental results are classified into three categories of the "p++ layers" resulting from the vapor-phase diffusion and the application diffusion; the "p+ layers" formed on the surfaces opposite to the application surfaces in the case of the application diffusion; and the "n layers" resulting from the vapor-phase diffusion for which the diffusion preventing masks were formed. With the classifications, discussion will be held below.

Each of the "n layers" had a sheet resistance almost unchanged under any etching condition, and its conductive type remained to be n type. Observing the state of surface of each silicon substrate, it was recognized that etching had progressed therein. Particularly, in the texture etching conditions of Table 3, the texture structures were formed on the entire surfaces thereof.

The "p+ layers" did not differ depending on conditions. In all the conditions, the p+ layers were completely removed and the n layers were exposed. The state of surface of each p+ layer was not different from that of each n layer. In the texture etching conditions of Table 3, the texture structures were formed on the entire surfaces of the silicon substrates under all the conditions.

Each of the "p++ layers" had a sheet resistance slightly different depending on conditions, but the n layers were not exposed under the etching conditions adopted herein; and the surfaces thereof remained flat in shape. Since each diffusion layer, in which boron was diffused in high concentration, had a thickness of 1 μm or smaller, it was recognized that even under the condition in which the sheet resistance was changed most greatly from 30Ω/☐ to 110Ω/☐, the surface of the p++ layer was etched just slightly. Further, the presence/absence of a boron silicide layer and a BSG layer apparently resulted in differences in sheet resistance, but a sufficient alkali resistance can be attained only with a p++ layer.

Although not shown in the Tables, etching resistances of n++ layers (sheet resistance: 10Ω/☐) formed through vapor-phase diffusion of $POCl_3$ onto surfaces of n type silicon substrates were also identified under the same conditions as those in Tables 2 and 3. In all the conditions, the n++ layers were completely etched to expose the n layers. In the texture etching conditions, texture structures were formed on the entire surfaces thereof.

The results above showed that only the p++ layers, in each of which boron was diffused in high concentration, exhibited great alkali resistances, and had characteristics completely different from not only the n layers and the n++ layer but also the p+ layers, which are of the same conductive type.

Surface concentrations of boron at the p++ layers formed by the application diffusion of boron and those at the p+ layers formed by the out-diffusion of boron were measured using an SIMS. The surface concentrations of boron at the p++ layers were $4\times10^{19}$ to $1\times10^{20}$ $cm^{-3}$, whereas the surface concentrations of boron at the p+ layers were less than $1\times10^{19}$ $cm^{-3}$. When a surface concentration of boron was equal to or higher than $1\times10^{19}$ $cm^{-3}$, the resistance to an alkali solution was increasingly high. Thus, it was revealed that a surface concentration of boron at a p++ layer is preferably equal to or greater than $1\times10^{19}$ $cm^{-3}$.

Example 1

A solar cell of an example 1, which corresponds to the foregoing first embodiment, was fabricated. Hence, the fabrication of the solar cell of example 1 will be described below with reference to FIGS. 1(a)-(f).

First, from a p type monocrystalline silicon wafer shaped in a substantially quadrangle having each side of 125 mm, a slice damage layer was removed using a sodium hydroxide solution to prepare a silicon substrate 1 having a flat surface and having a thickness of approximately 180 μm (FIG. 1(a)).

Next, the back surface of silicon substrate 1 was spin-coated with a solution containing boron and thereafter was heated to diffuse boron into the back surface of silicon substrate 1, thereby forming a p++ layer 2. On this occasion, no diffusion preventing mask was formed on the light receiving surface of silicon substrate 1, and therefore a p+ layer 3 was formed on the light receiving surface of silicon substrate 1 as a result of out-diffusion of boron. Further, on the respective surfaces of p++ layer 2 and p+ layer 3, layered bodies 4 each constituted by a boron silicide layer and a BSG layer were formed (FIG. 1(b)). Here, the application diffusion of boron was performed by heating silicon substrate 1 to 950° C. under mixed atmosphere of nitrogen and oxygen and then annealing it under oxygen atmosphere after the temperature of silicon substrate 1 was decreased to 800° C. Thereafter, a hydrogen fluoride solution was employed to remove layered bodies 4, each constituted by the boron silicide layer and the BSG layer, from the respective surfaces of p++ layer 2 and p+ layer 3

Next, for texture etching, silicon substrate 1 was immersed for 30 minutes in an etching solution including a 2.5% potassium hydrate solution and isopropyl alcohol and heated to 80° C., thereby forming a texture structure 6 at the light receiving surface of silicon substrate 1 (FIG. 1(c)). Here, the sheet resistance of p++ layer 2 on the back surface of silicon substrate 1 was identified before and after the texture etching. Before the texture etching, the sheet resistance thereof was 28Ω/☐. After the texture etching, the sheet resistance thereof was substantially unchanged at 27Ω/□. Furthermore, the surface of p++ layer 2 remained flat in shape and was therefore unchanged.

Next, an atmospheric pressure CVD method was employed to form an silicon oxide film on the back surface of silicon substrate 1. Using the silicon oxide film as a diffusion preventing mask, POCl₃ was introduced for vapor-phase diffusion into silicon substrate 1, which has a temperature of 800° C. In this way, phosphorus was diffused into the light receiving surface of silicon substrate 1, thereby forming an n+ layer 7. Thereafter, the diffusion preventing mask and a PSG film formed in association with the diffusion of phosphorus were removed using a hydrogen fluoride solution (FIG. 1(d)).

Thereafter, a plasma CVD method was employed to form silicon nitride films on the light receiving surface and back surface of silicon substrate 1. In this way, a passivation film 8 also serving as an anti-reflection film was formed on the light receiving surface of silicon substrate 1 and a passivation film 9 was formed on the back surface of silicon substrate 1 (FIG. 1(e)).

Finally, a silver paste was printed in the form of a lattice onto the back surface of silicon substrate 1 using a screen-printing method and was thereafter dried. Then, a silver paste was also printed in the form of a lattice onto the light receiving surface of silicon substrate 1 using a screen-printing method and thereafter dried. Then, these silver pastes were sintered for fire-through of the silver pastes, thereby forming electrodes 10 for n type in contact with n+ layer 7 of the light receiving surface of silicon substrate 1 and forming electrodes 11 for p type in contact with p++ layer 2 of the back surface of silicon substrate 1. In this way, the solar cell was completed (FIG. 1(f)).

Example 2

A solar cell of an example 2, which corresponds to the foregoing second embodiment, was fabricated. Hence, the fabrication of the solar cell of example 2 will be described below with reference to FIGS. 2(a)-(g).

First, a silicon substrate 1 similar to that in example 1 was prepared (FIG. 2(a)). Then, silicon substrate 1 was thermally oxidized at 1000° C. for 60 minutes to form silicon oxide films 12 on the light receiving surface and back surface of silicon substrate 1 respectively. Thereafter, an atmospheric pressure CVD method was employed to form an silicon oxide film 13 having a thickness of 800 μm on silicon oxide film 12 provided on the back surface of silicon substrate 1 (FIG. 2(b)).

Next, a paste containing a phosphoric acid as a main component was printed onto portions of a surface of silicon oxide film 13 provided on the back surface of silicon substrate 1 and was heated, whereby circular open portions each having a diameter of 200 μm were provided at a pitch of 300 μm on silicon oxide film 12 and silicon oxide film 13.

Thereafter, a solution containing boron was applied entirely onto the back surface of silicon substrate 1, which was then heated at 950° C. under mixed atmosphere of nitrogen and oxygen, and was then annealed under oxygen atmosphere after the temperature thereof was decreased to 800° C. In this way, in the open portions of the back surface of silicon substrate 1, p++ layers 2 and a layered body 4 constituted by a boron silicide layer and a BSG layer were formed (FIG. 2(c)).

Thereafter, silicon oxide film 12 formed through thermal oxidation of the light receiving surface of silicon substrate 1 was removed using a hydrogen fluoride solution. On this occasion, layered body 4 constituted by the boron silicide layer and the BSG layer were removed too.

Thereafter, by texture etching performed under the same conditions as those in example 1, a texture structure 6 was formed on the light receiving surface of silicon substrate 1. On this occasion, portions other than p++ layers 2 on the back surface of silicon substrate 1 were protected by silicon oxide film 13 formed by the atmospheric pressure CVD (FIG. 2(d)).

Next, a silicon oxide film was further formed on the back surface of silicon substrate 1 using an atmospheric pressure CVD method. Using the silicon oxide film as a diffusion preventing mask, vapor-phase diffusion was performed with POCl₃ at 800° C. to form an n+ layer 7 on the light receiving surface of silicon substrate 1. Thereafter, a hydrogen fluoride solution was used to remove a PSG film formed on the light receiving surface of silicon substrate 1 in association with the diffusion of phosphorus and portions of silicon oxide film 13 formed on the back surface of silicon substrate 1 (FIG. 2(e)).

Then, a plasma CVD method was employed to form a silicon nitride film on the light receiving surface of silicon substrate 1, thereby forming a passivation film 8 also serving as an anti-reflection film (FIG. 2(f)).

Next, a silver paste was screen-printed in the form of dots onto the surface of the silicon oxide film provided on p++ layers 2 formed on the back surface of silicon substrate 1, and then was dried. Thereafter, a silver paste was printed in the form of a lattice onto the light receiving surface of silicon substrate 1. These silver pastes were sintered for fire-through thereof to form electrodes 10 for n type in contact with n+ layer 7 on the light receiving surface of silicon substrate 1 and form electrodes 11 for p type in contact with p++ layers 2 on the back surface of silicon substrate 1. In this way, the solar cell was completed (FIG. 2(g)).

Thereafter, a silver paste not for fire-through with the silicon oxide film was printed in the form of a lattice to connect the dot-shaped electrodes 11 for p type to one another on the back surface of silicon substrate 1, and was then sintered to form electrodes for power collection. In this way, the solar cell was completed.

Example 3

A solar cell of an example 3, which corresponds to the foregoing third embodiment, was fabricated. Hence, the fabrication of the solar cell of example 3 will be described below with reference to FIGS. 3(a)-(g).

First, the fabrication was done in the same way as in example 1 until the step of forming a texture structure 6 on the light receiving surface of silicon substrate 1 (FIGS. 3(a)-(c)).

Next, diffusion preventing masks 5 each constituted by a silicon oxide film were formed on the light receiving surface and back surface of silicon substrate 1 using an atmospheric pressure CVD method. Then, on the entire surface of diffusion preventing mask 5 provided on the light receiving surface of silicon substrate 1, an acid-resistant resist (not shown) was formed, whereas on portions of diffusion preventing mask 5 provided on the back surface of silicon substrate 1, an acid-resistant resist (not shown) was formed using a screen-printing method.

Thereafter, diffusion preventing mask 5 on the back surface of silicon substrate 1 was etched using a mixed acid adjusted by a water and an acetic acid so that a hydrofluoric acid was 3% and a nitric acid was 10% therein. Accordingly, portions of p++ layer 2 that correspond to the open portions in the acid-resistant resist on the back surface of silicon substrate 1 were removed (FIG. 3(d)).

Then, the acid-resistant resists were removed respectively from the light receiving surface and back surface of silicon substrate 1, and thereafter n+ layers 7 were formed on portions of the back surface of silicon substrate 1 by means of vapor-phase diffusion with $POCl_3$. Thereafter, a PSG film (not shown) formed in association with the diffusion of phosphorus and diffusion preventing masks 5 were removed using a hydrogen fluoride solution (FIG. 3(e)).

Next, a passivation film 8 constituted by a silicon nitride film was formed on the light receiving surface of silicon substrate 1 using a plasma CVD method, and a passivation film 9 constituted by a silicon nitride film was formed on the back surface of silicon substrate 1 using a plasma. CVD method (FIG. 3(f)).

Finally, a silver paste was printed onto the surface of passivation film 9 provided on the back surface of silicon substrate 1, and was sintered for fire-through of the silver paste, thereby forming electrodes 10 for n type on n+ layers 7 provided on the back surface of silicon substrate 1 and forming electrodes 11 for p type on p++ layer 2 provided on the back surface of silicon substrate 1. In this way, the solar cell was completed (FIG. 3(g)).

Example 4

A solar cell of an example 4, which corresponds to the foregoing fourth embodiment, was fabricated. Hence, the fabrication of the solar cell of example 4 will be described below with reference to FIGS. 4(a)-(g).

First, a silicon substrate 1 of n type was prepared (FIG. 4(a)). Next, on the back surface of silicon substrate 1, a silicon oxide film 5 was formed as a diffusion preventing mask also serving as a texture mask, using an atmospheric pressure CVD method. Silicon oxide film 5 thus formed had a thickness of 800 nm.

Then, onto the light receiving surface of silicon substrate 1, a solution containing boron was printed using a screen-printing method into the same shape as that of each electrode to be formed in the light receiving surface. Thereafter, under mixed atmosphere of nitrogen and oxygen, silicon substrate 1 was heated to 950° C. to diffuse boron into the light receiving surface of silicon substrate 1. In this way, p++ layers 2 were formed. On this occasion, due to out-diffusion of boron, p+ layers 3 were formed on the light receiving surface of silicon substrate 1 at portions other than p++ layers 2, and a layered body 4 constituted by a boron silicide layer and a BSG layer was formed on p++ layers 2 and p+ layers 3 (FIG. 4(b)).

Next, by texture etching performed under the same conditions as those in example 1, p+ layers 3 formed by the out-diffusion of boron on the light receiving surface of silicon substrate 1 were etched to form a texture structure 6, but p++ layers 2, which were shaped corresponding to the shapes of electrodes to be formed on the light receiving surface, remained flat in shape (FIG. 4(c)).

Next, vapor-phase diffusion was performed using $BBr_3$ to diffuse boron into texture structure 6 of the light receiving surface of silicon substrate 1, thereby forming a p+ layer 3. P+ layer 3 was formed by heating silicon substrate 1 to 900° C., performing vapor-phase diffusion using $BBr_3$, and annealing it under oxygen atmosphere after the temperature thereof was decreased to 800° C. Hence, each of p++ layers 2 had a sheet resistance of approximately 30Ω/□ while p+ layer 3 had a sheet resistance of approximately 100Ω/□. Thereafter, a hydrogen fluoride solution was employed to remove a boron silicide layer and a BSG layer, both formed together with p+ layer 3, as well as silicon oxide film 5 formed on the back surface of silicon substrate 1 (FIG. 4(d)).

Then, a diffusion preventing mask (not shown) constituted by a silicon oxide film was formed on the light receiving surface of silicon substrate 1, using an atmospheric pressure CVD. Vapor-phase diffusion of phosphorus was performed using $POCl_3$ with the temperature of silicon substrate 1 being at 900° C. to form an n+ layer 7 on the back surface of silicon substrate 1. Thereafter, a hydrogen fluoride solution was employed to remove the diffusion preventing mask from the light receiving surface of silicon substrate 1 and remove from the back surface of silicon substrate 1 a PSG film formed in association with the diffusion of phosphorus (FIG. 4(e)).

Then, a silicon nitride film was formed on the light receiving surface of silicon substrate 1 using a plasma CVD method, thereby forming a passivation film 8 also serving as an anti-reflection film. Meanwhile, a silicon nitride film was formed on the back surface of silicon substrate 1 using a plasma CVD method, thereby forming a passivation film 9 (FIG. 4(f)).

Finally, a silver paste was printed onto the back surface of silicon substrate 1 in the form of a lattice using a screen-printing method, and thereafter was dried. Then, a silver paste was printed onto the light receiving surface of silicon substrate 1 in the form of a lattice, and thereafter was dried. Then, they were sintered for fire-through of the silver pastes to form electrodes 11 for p type on p++ layers 2 formed on the light receiving surface of silicon substrate 1 and to form electrodes 10 for n type on n+ layer 7 formed on the back surface of silicon substrate 1. In this way, the solar cell was completed (FIG. 4(g)).

It should be considered that the embodiments and examples disclosed herein are illustrative and non-restrictive in any respect. The scope of the present invention is defined by the scope of claims, and is intended to include any modifications within the scope and meaning equivalent to the terms of the claims.

Industrial Applicability

The present invention provides a method for manufacturing a solar cell excellent in power generation efficiency, inexpensively.

The invention claimed is:

1. A method for manufacturing a solar cell, comprising:
    diffusing p type impurity into at least a portion of a first surface, which is one surface of a silicon substrate, to form a high concentration p type impurity diffusion layer;
    etching one of said first surface of said silicon substrate and a second surface of said silicon substrate opposite to said first surface, using as a mask at least one of said high concentration p type impurity diffusion layer and a film formed on said high concentration p type impurity diffusion layer upon forming said high concentration p type impurity diffusion layer; and
    wherein said high concentration p type impurity diffusion layer is formed by diffusing boron into said first surface of said silicon substrate as said p type impurity, said film is a layered body constituted by a boron silicide layer and a boron silicate glass layer, said etching is wet etching employing an alkali solution, and at least one selected from a group consisting of said high concentration p type impurity diffusion layer, said boron silicide layer, and said boron silicate glass layer serves as said mask.

2. The method for manufacturing a solar cell according to claim 1, wherein said high concentration p type impurity diffusion layer has a surface whose concentration of boron is not less than $1 \times 10^{19}$ atoms/cm$^3$.

3. The method for manufacturing a solar cell according to claim 1, wherein said etching is performed onto said second surface of said silicon substrate to form an anti-reflection structure at said second surface of said silicon substrate.

4. The method for manufacturing a solar cell according to claim 1, further comprising diffusing p type impurity into said first surface of said silicon substrate after said etching while a temperature of said silicon substrate is set lower than that of said silicon substrate upon forming said high concentration p type impurity diffusion layer, so as to form a p type impurity diffusion layer having a p type impurity concentration lower than that of said high concentration p type impurity diffusion layer.

5. The method for manufacturing a solar cell according to claim 1, wherein said first surface of said silicon substrate is flat.

6. The method for manufacturing a solar cell according to claim 1, wherein said silicon substrate has a thickness of 200 µm or smaller.

* * * * *